(12) United States Patent
Chang et al.

(10) Patent No.: US 7,402,848 B2
(45) Date of Patent: Jul. 22, 2008

(54) INTEGRATED CIRCUIT HAVING GATES AND ACTIVE REGIONS FORMING A REGULAR GRATING

(75) Inventors: Leland Chang, New York, NY (US); Hon-Sum Philip Wong, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/761,741

(22) Filed: Jun. 12, 2007

(65) Prior Publication Data

US 2007/0235764 A1 Oct. 11, 2007

Related U.S. Application Data

(63) Continuation of application No. 11/065,837, filed on Feb. 25, 2005.

(60) Provisional application No. 60/633,200, filed on Dec. 3, 2004.

(51) Int. Cl.
*H01L 29/80* (2006.01)

(52) U.S. Cl. .................................................. 257/206

(58) Field of Classification Search ................ 257/202, 257/204, 206, 208, 211
See application file for complete search history.

(56) References Cited

U.S. PATENT DOCUMENTS

| | | | | |
|---|---|---|---|---|
| 5,359,226 A | * | 10/1994 | DeJong | 257/773 |
| 5,612,552 A | * | 3/1997 | Owens | 257/202 |
| 5,742,086 A | * | 4/1998 | Rostoker et al. | 257/300 |
| 6,534,805 B1 | | 3/2003 | Jin | |
| 6,812,534 B2 | * | 11/2004 | Ishigaki et al. | 257/401 |

OTHER PUBLICATIONS

M. Ishida et al., "A Novel 6T-SRAM Cell Technology Designed with Rectangular Patterns Scalable beyond 0.18 μm Generation and Desirable for Ultra High Speed Operation," IEEE, 4 pages, 1998.

* cited by examiner

*Primary Examiner*—M. Wilczewski
*Assistant Examiner*—Swapneel Chhaya
(74) *Attorney, Agent, or Firm*—Ido Tuchman; Ryan, Mason & Lewis, LLP (57) ABSTRACT

A semiconductor device includes a plurality of repeatable circuit cells connectable to one or more conductors providing at least electrical connection to the circuit cells and/or electrical connection between one or more circuit elements in the cells. Each of the circuit cells are configured having gates and active regions forming a grating, wherein, for a given active layer in the device, a width of each active region is substantially the same relative to one another, a spacing between any two adjacent active regions is substantially the same, a width of each gate is substantially the same relative to one another, and a spacing between any two adjacent gates is substantially the same.

1 Claim, 10 Drawing Sheets

INTEGRATED CIRCUIT HAVING GATES AND ACTIVE REGIONS FORMING A REGULAR GRATING

CROSS-REFERENCE TO RELATED APPLICATION(S)

This application is a continuation of U.S. application Ser. No. 11/065,837, filed on Feb. 25, 2005, which claims the benefit of priority to U.S. Provisional Application Ser. No. 60/633,200, filed on Dec. 3, 2004, the disclosures of which are incorporated by reference herein.

FIELD OF THE INVENTION

The present invention relates generally to semiconductor devices, and more particularly relates to an integrated circuit (IC) device configured such that both gates and active regions in the device form a regular grating.

BACKGROUND OF THE INVENTION

Many IC devices, such as, for example, complementary metal-oxide semiconductor (CMOS) devices, are formed comprising a plurality of essentially identical repeated circuit cells, such as, for example, a static random access memory (SRAM) array. As CMOS fabrication technologies advance, SRAM can remain a primary mechanism for affording logic-compatible, high-speed embedded nonvolatile memory, provided corresponding improvements in SRAM cell packing density can be achieved. In order to improve packing density, full scaling of all critical dimensions in the SRAM cell is generally required, which poses significant challenges in process integration, especially in lithography patterning techniques. These challenges include both the resolution of small features as well as the controllability of critical dimensions from device to device, or from wafer to wafer. Such process variations can affect one or more characteristics of the device, including, but not limited to, device threshold voltage, which can severely degrade device yield and/or stability, particularly at reduced power supply voltages. Additionally, it becomes increasing more difficult to fabricate complex geometries in the IC device as dimensions are reduced. Consequently, devices are preferably formed using Manhattan (e.g., x-y) coordinates.

In recent years, there has been a transition from device designs utilizing completely arbitrary pattern sizes and orientations to semi-constrained designs, especially relating to memory design. Semi-constrained designs typically involve maintaining a substantially fixed gate pattern pitch throughout the device. However, gate length is not always fixed. Furthermore, active regions (e.g., source and drain regions) in these devices use varied line dimensions and line spacings, as described, for example, in U.S. Pat. No. 6,534,805 to Jin, the disclosure of which is incorporated by reference herein. Consequently, full scaling of such devices, so as to benefit from shrinking process dimensions, is not easily attainable.

There exists a need, therefore, for a semiconductor design methodology suitable for use, for example, in an SRAM array, which does not suffer from one or more of the above-noted deficiencies associated with conventional semiconductor design approaches.

SUMMARY OF THE INVENTION

The present invention, in an illustrative embodiment thereof, provides semiconductor device layout techniques in which both gates and active regions in the device form completely periodic gratings. When device features are comprised of regular patterns based on substantially fixed line widths and spacings, resolution and controllability of critical device dimensions can be advantageously improved. This is due, at least in part, to the fact that patterning techniques do not need to achieve arbitrary shapes, and can thus be optimized for a single line width and space combination. In addition to easing lithography constraints, the techniques of the present invention facilitate the introduction of new high-resolution patterning technologies. Moreover, self-assembly techniques that can precisely define periodic gratings can be more easily employed with a device formed in accordance with the layout techniques of the present invention.

In accordance with one aspect of the invention, a semiconductor device is formed comprising a plurality of repeatable circuit cells connectable to one or more conductors providing at least one of electrical connection to the circuit cells and electrical connection between one or more circuit elements in the cells. Each of the circuit cells are configured having gates and active regions forming a grating, wherein, for a given active layer in the device, a width of each active region is substantially the same relative to one another, a spacing between any two adjacent active regions is substantially the same, a width of each gate is substantially the same relative to one another, and a spacing between any two adjacent gates is substantially the same.

In accordance with another aspect of the invention, in a semiconductor device comprising a plurality of repeatable circuit cells, a method for laying out a given one of the circuit cells includes the steps of forming a plurality of active regions in the given circuit cell, and forming a plurality of gates in the given circuit cell. The active regions and gates are connectable to one or more conductors providing at least electrical connection to the circuit cell and/or electrical connection between the circuit cell and one or more other circuit cells in the semiconductor device. The active regions form a grating, wherein for a given active layer in the circuit cell a width of each of the active regions is substantially the same relative to one another, and a spacing between any two adjacent active regions is substantially the same. Likewise, the gates form a grating, wherein a width of each of the gates is substantially the same relative to one another, and a spacing between any two adjacent gates is substantially the same.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described herein in the context of an illustrative memory cell for use in an SRAM array comprising a plurality of such memory cells. It should be appreciated, however, that the invention is not limited to this or any particular memory cell configuration. Rather, the invention is more generally applicable to techniques for forming a semiconductor device which may include a plurality of repeated circuit cells, each of the circuit cells being configured such that both gate and active regions in a given layer of the cell form a substantially regular grating. The term "grating" as used herein is intended to refer to a framework of equidistant and parallel lines which may be arranged in a crisscrossed pattern. The term "grating" is often used interchangeably with the term "grid." In addition to providing increased scalability of the device, thereby beneficially increasing a packing density thereof, the techniques of the present invention described herein can be employed to ease constraints on the lithography process and to improve device yield, thus reducing the overall cost of manufacturing the IC device.

With the advent of 65 nanometer (nm) fabrication technology and beyond, resolution and control of critical dimension variation becomes even more imperative. Since SRAM arrays often utilize perhaps some of the most stringent design rules for IC fabrication, migration to a regular grating-based design can significantly improve packing density and/or chip yield. This is, at least in part, due to the fact that substantially all IC process steps can be optimized for an individual line width and spacing combination rather than for arbitrary shapes. Likewise, with the development of self-assembly techniques that can achieve well-controlled line pitches beyond the capabilities of standard lithography, the grating-based circuit layout technique of the present invention may become particularly important, since most of these techniques can more readily form periodic gratings.

Figure 1:
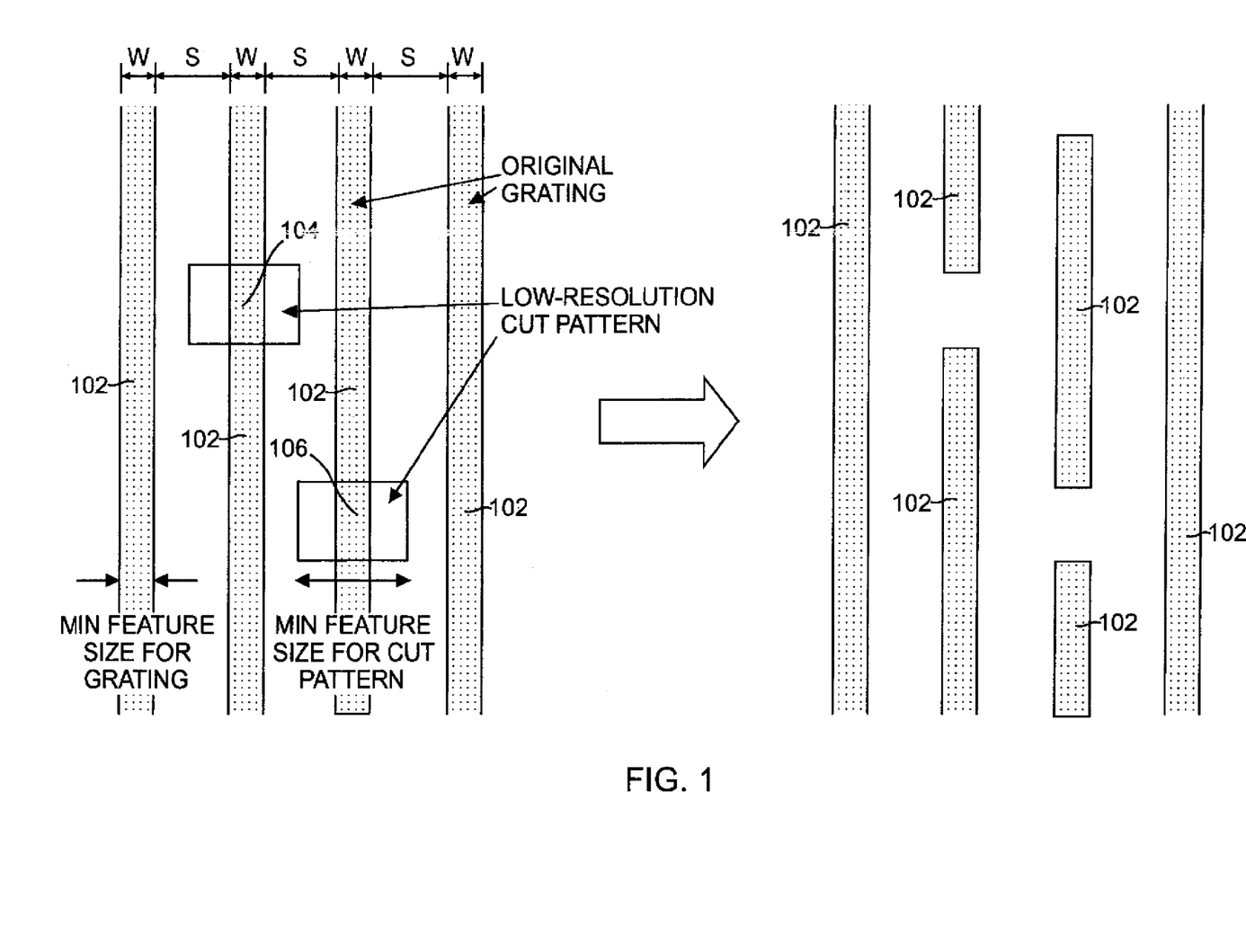
FIG. 1 is a top plan view depicting an exemplary photolithographic patterning process for converting an original grating into a plurality of active region of desired lengths, in accordance with one aspect of the present invention.

Since a dense circuit layout is typically even more critical in SRAM than in general digital logic or in analog circuitry, it is important to find efficient methods for forming an SRAM unit cell. Since an SRAM circuit often comprises arbitrarily shaped active regions, a two-step patterning process is preferably used to convert a regular grating pattern (original grating) into appropriately interconnected shapes used to represent the arbitrarily shaped active regions in the original design, as shown in FIG. 1. The term "regular grating" as may be used herein is intended to refer to a pattern comprising a plurality of substantially parallel structures, each structure having the same width and spacing relative to one another throughout the pattern.

As apparent from the figure, the grating pattern may comprise a plurality of active regions 102 having substantially equal widths W relative to one another and having substantially equal spacings S between any two adjacent active regions. Rather than defining the desired lengths of the active regions beforehand when the active regions are first formed, which requires more precise control over certain process features (e.g., line width), we can start with an original grating and perform a second patterning step, which can be implemented using far less aggressive technology than needed to form the original grating. Specifically, this second patterning step is preferably used only to remove certain portions 104, 106 of the grating pattern, and merely needs to be aligned within the grating spacing S. The second patterning step requires only enough line width control to ensure coverage of the grating line within grating spacing S. This two-step process could also be used in any patterning technique (e.g., optical lithography) for which formation of a complete grating pattern improves resolution and critical dimension (CD) control.

The techniques of the present invention described herein can be applied to silicon-based fabrication techniques, in which patterning is targeted for traditional silicon CMOS. As will be understood by those skilled in the art, these same concepts can be straightforwardly extended to post-silicon technologies, such as, for example, carbon nanotube field-effect transistors (FETs) or other nanowire FETs, in which grating-like arrays of devices may serve as a starting point in the fabrication process.

Figure 2:
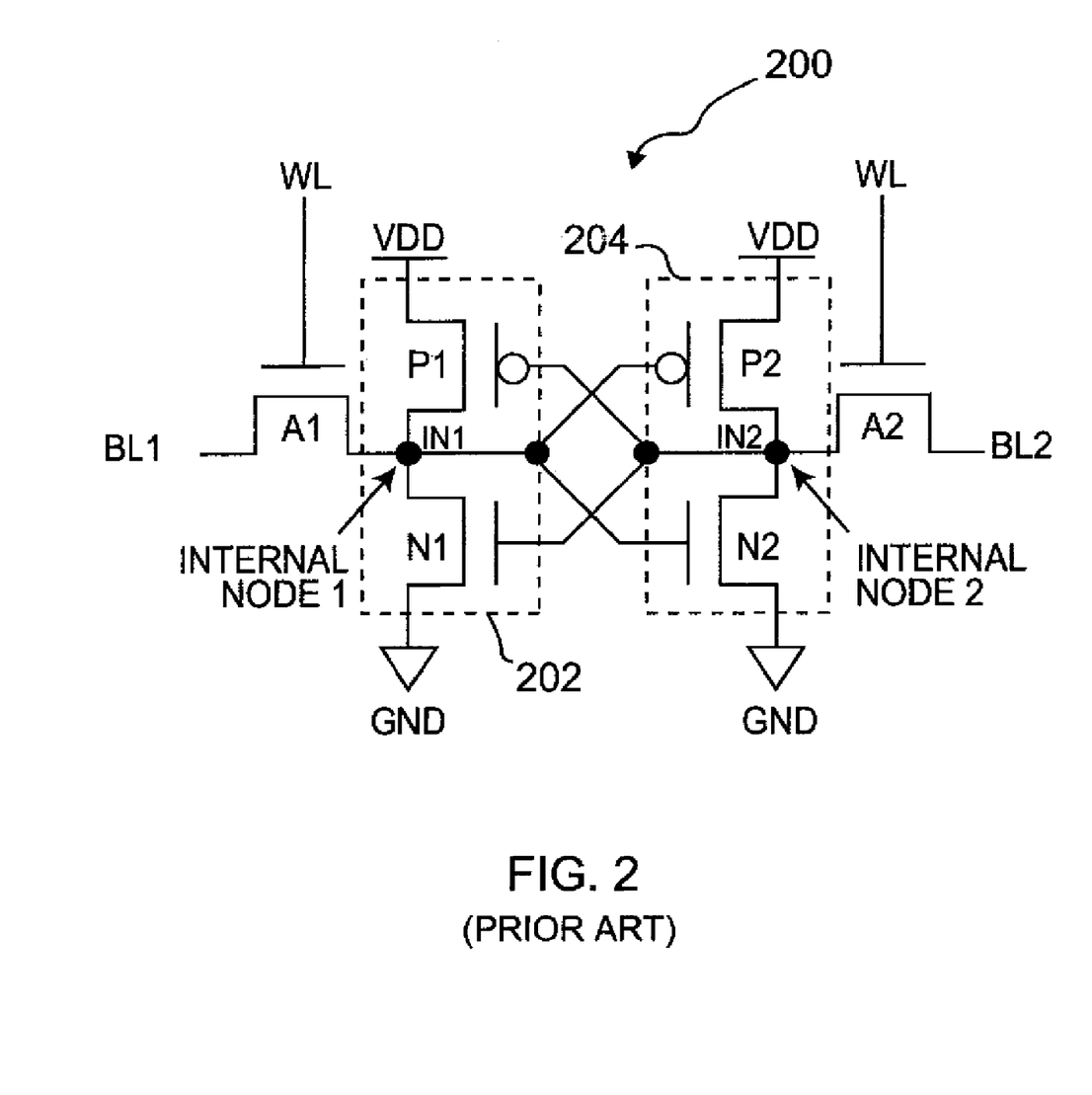
FIG. 2 is a schematic diagram depicting a standard six-transistor SRAM unit cell.
Figure 3:
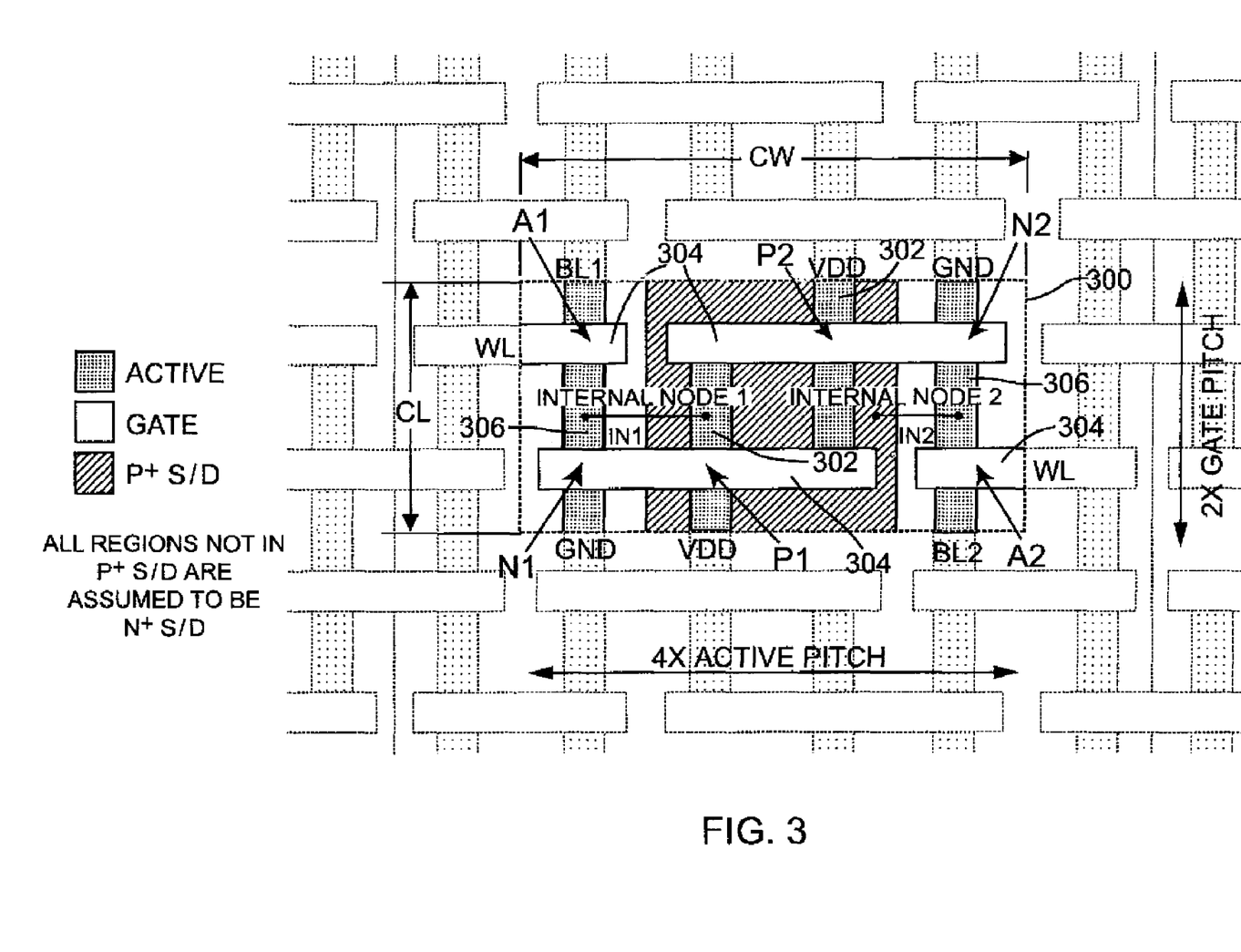
FIG. 3 is a top plan view depicting at least a portion of an exemplary grating-based SRAM unit cell layout, formed in accordance with an illustrative embodiment of the invention.

FIG. 2 is a schematic diagram depicting a standard 6-transistor (6-T) SRAM unit cell 200. The SRAM cell 200 includes two inverters 202, 204, and a pair of pass gates A1, A2. The two inverters 202, 204 are connected in a cross-coupled configuration, such that an input of a first inverter (e.g., 202) is coupled to an output of a second inverter, and each pass gate A1, A2 is coupled to an output of a corresponding inverter 202 and 204 which forms an internal node IN1, IN2, respectively, for storing a logical state of the cell. The layout strategies of the invention discussed herein pertain to SRAM cell 200, but could easily be extended to other circuits having alternative transistor configurations and/or device counts. An exemplary grating-based layout 300 of the SRAM unit cell 200 is shown in FIG. 3. As depicted in FIG. 3, P-type active regions 302, N-type active regions 306, and gate lines 304 are formed on a regular grating broken up in certain regions, such as, for example, by defining the desired active regions beforehand in the original patterning step, or by removing desired portions of the original grating (see, e.g., FIG. 1). As is known by those skilled in the art, the P-type active regions 302 may be formed by modifying defined active regions in the device by adding a P-type impurity or dopant, such as, for example, boron, of a known concentration level so as to change the conductivity of the material as desired. Similarly, the N-type active regions 306 may be formed by modifying defined active regions in the device by adding an N-type impurity or dopant, such as, for example, phosphorus or arsenic, of a known concentration level to change the conductivity of the material as desired.

By way of example only and without loss of generality, the inverters 202, 204, comprising transistor devices P1 and N1, and devices P2 and N2, respectively, are preferably formed by a single gate line stretching across P-type (P+) and N-type (N+) active regions 302 and 306, respectively. Each N-type pull-down transistor device (N1 or N2) shares its drain with a corresponding N-type pass-gate access device (A1 or A2). The two half-cells of SRAM unit cell 200 (FIG. 2), comprising transistor devices A1, N1, P1 or A2, N2, P2, preferably exhibit mirror symmetry in order to allow for cross-coupling of the two inverters. The area of the SRAM unit cell will be dependent on the gate and active region pitch, where the term "pitch" may be defined as a width of the gate or active region plus spacing between adjacent gate or active regions, respectively, in the grating. For the illustrative SRAM cell 300 of FIG. 3, the area is equal to a cell width CW of four times the active region pitch, multiplied by a cell length CL of twice the gate pitch.

Figure 4:
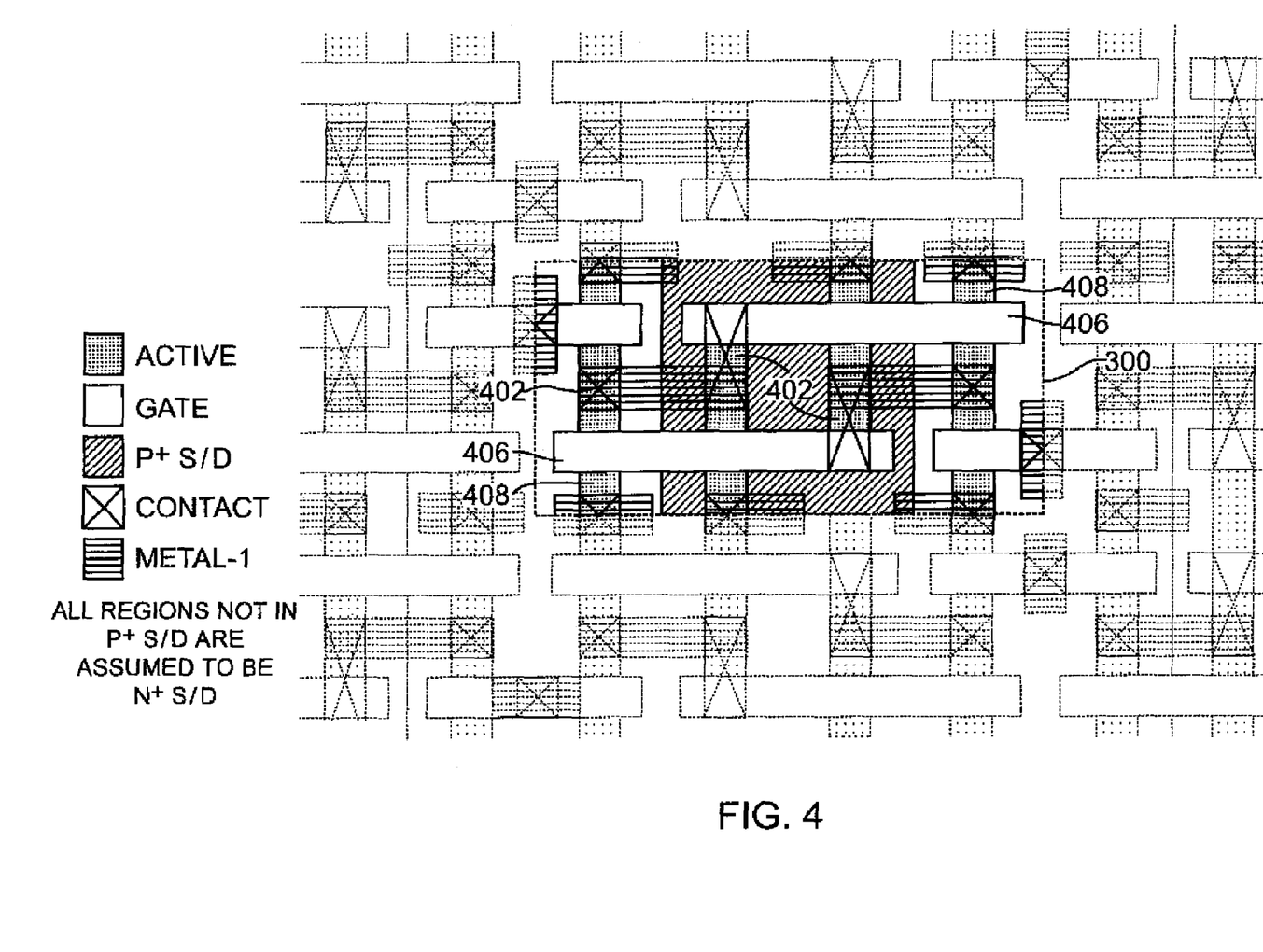
FIG. 4 is a top plan view depicting at least a portion of the exemplary grating-based SRAM unit cell layout shown in FIG. 3 with metallization added, formed in accordance with an embodiment of the invention.

Depending on metallization options provided by the IC process (e.g., local interconnect, contacts, vias, etc.), interconnection of individual unit cells can be achieved through many different ways, and is thus not a primary focus of the present invention. An exemplary connection methodology for the SRAM unit cell 300 is shown in FIG. 4, which assumes that first layer metal (e.g., metal-1) contact plugs 402 can be used to simultaneously contact gate 406 and active regions 408 to connect the two inverters in a cross-coupled arrangement. For simplicity, contacts 402 are pictured to be substantially the same feature size as the grating lines. However, this need not be the case, as contacts can be larger than the active regions, as long as neighboring shapes do not merge together.

Figure 5:
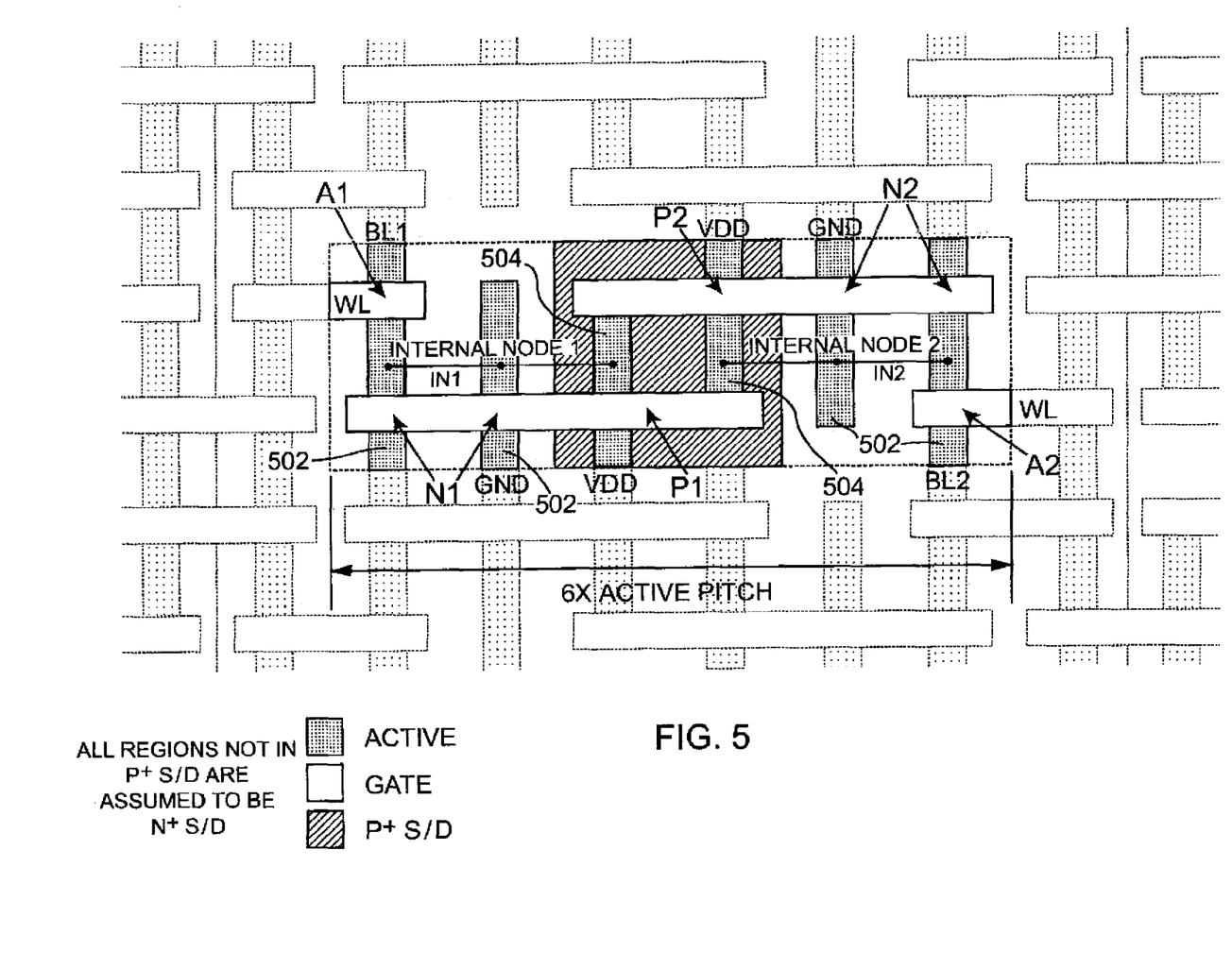
FIG. 5 is a top plan view depicting at least a portion of an exemplary grating-based SRAM unit cell layout including transistor devices having modified effective device widths, formed in accordance with an embodiment of the invention.

The layout depicted in FIG. 3 has a beta ($\beta$) ratio, which may be defined as a ratio of pull-down transistor to pass-gate transistor strengths, of one because the devices are of exactly the same dimensions. The relative strength of a given transistor is generally specified in terms of its channel width (W) and channel length (L). To improve cell stability during a read access, for example, it is often desirable to increase the $\beta$ ratio to about two or higher. To achieve this, additional grating lines corresponding to the pull-down devices can be electrically connected together in parallel to increase the effective widths (and thus strengths) of the pull-down devices N1 and N2. For example, as shown in the top plan view of FIG. 5, each of devices N1 and N2 may comprise two N-type active area regions 502, compared to devices P1 and P2, which are each formed of a single P-type active area region 504. This approach may have a slight area penalty associated therewith, since the cell width in the illustrative embodiment of FIG. 5 will increase to six times the active line pitch, assuming two grating lines are used for the pull-down devices N1 and N2. However, the manufacturability benefits (e.g., increased device yield, reduced fabrication costs, etc.) achieved by using this methodology may outweigh any increase in area.

Figure 6:
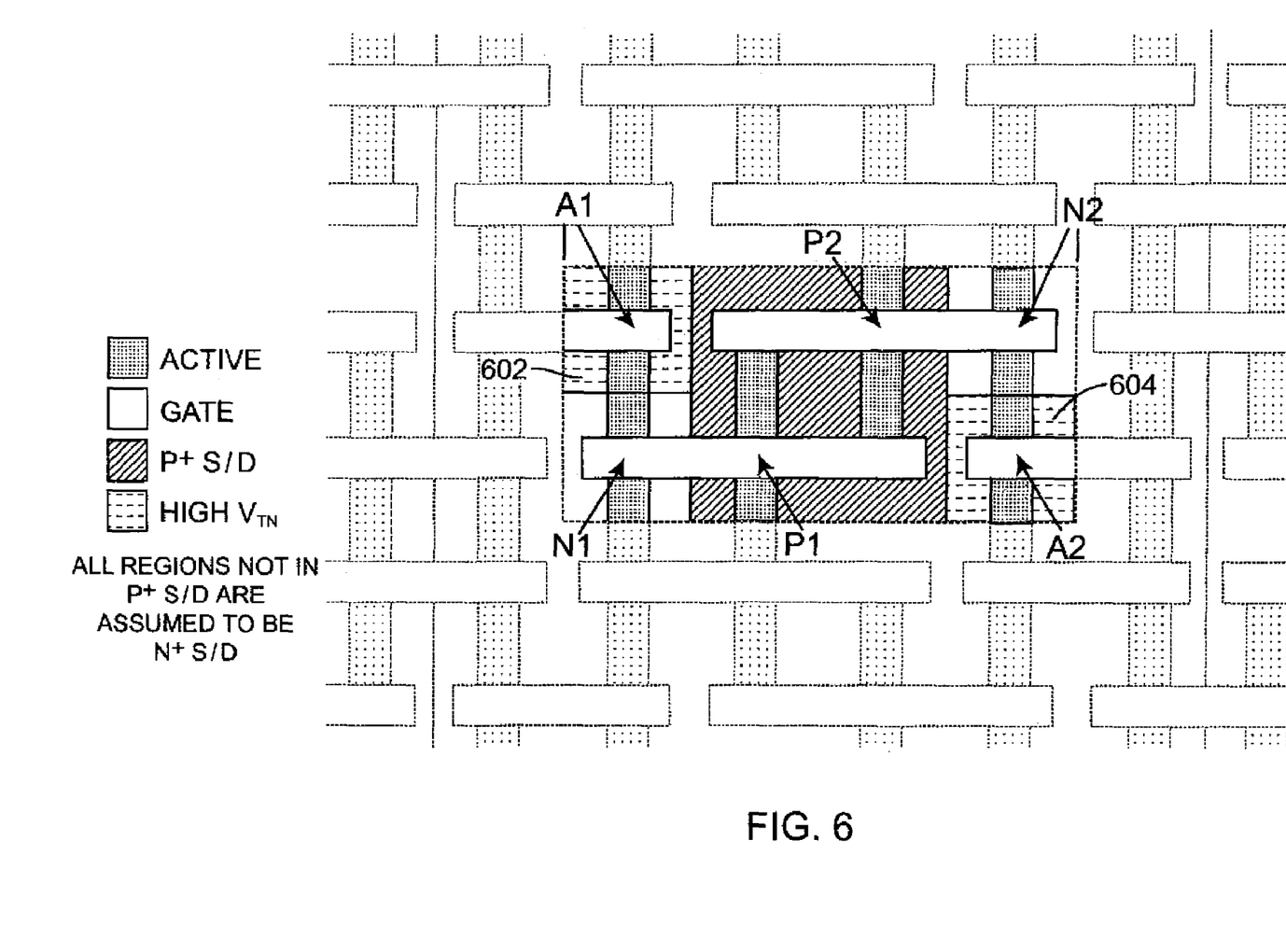
FIG. 6 is a top plan view depicting at least a portion of an exemplary grating-based SRAM unit cell layout including transistor devices having modified threshold implants, formed in accordance with an embodiment of the invention.

In order to avoid this area increase, the $\beta$ ratios can alternatively be increased by separately adjusting the threshold voltages of the pass-gate devices A1, A2 and/or pull-down devices N1, N2 as desired, in accordance with another aspect of the invention. This methodology can be accomplished, for instance, through a masked implantation, an example of which is shown in the top plan view of FIG. 6, which, like the second cut mask described in conjunction with FIG. 1, requires a lithography step with far less aggressive line dimension control. As apparent from FIG. 6, selected regions 602 and 604 of the cell may be doped to a higher impurity concentration level, so as to increase the threshold voltage of devices (e.g., transistors A1 and A2) formed in these regions.

In accordance with an important aspect of the present invention, for substantially all of the grating-based layouts discussed herein, the SRAM unit cell area is determined by the pitch of both the gate and active region gratings. In an illustrative embodiment of the invention, the gate pitch is substantially limited by the minimum spacing needed to place a contact between adjacent gate lines. As can be seen in FIG. 3, the design is very regular, such that every gate shape has contacts above and below. Thus, gate pitch may be determined in accordance with the expression:

Gate pitch=Gate length+Contact size+Contact-to-Gate overlay margin

Figure 7:
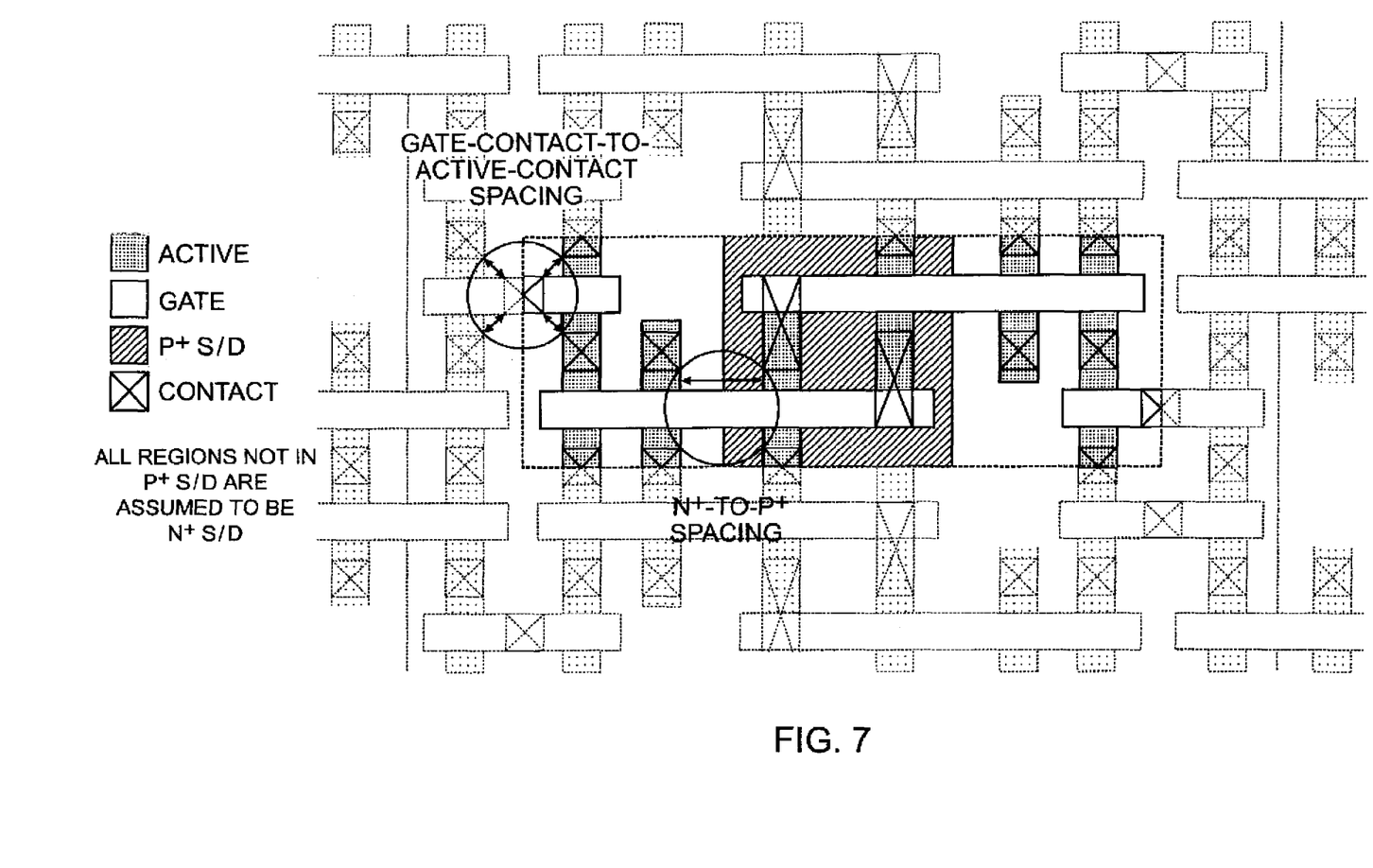
FIG. 7 is a top plan view depicting at least a portion of an exemplary grating-based SRAM unit cell layout employing a fine pitch active grating for satisfying one or more design rule requirements, in accordance with the present invention.

Determining the active line pitch is generally not as straightforward, since many different ground rules must be satisfied which makes the active region somewhat irregular. In the simplest case, the layouts in FIGS. 3 through 6 can be used by setting the active pitch equal to the maximum dimension needed to satisfy essentially all IC design rules corresponding to the IC process used. However, an optimum area would more likely be achieved by reducing the pitch from this maximum value. As shown in the exemplary SRAM unit cell layout of FIG. 7, this would require that entire grating lines be removed during the two-step patterning process to accommodate design rules including, for example, an N+-to-P+ spacing, gate-contact-to-active spacing, or any alternative technology-dependent design rules that may become important under a given set of process capabilities. For any given technology, there will exist an optimum point at which the active line pitch and number of grating lines to be removed can be chosen to satisfy all designs rules while providing a minimum cell area.

Figure 8:
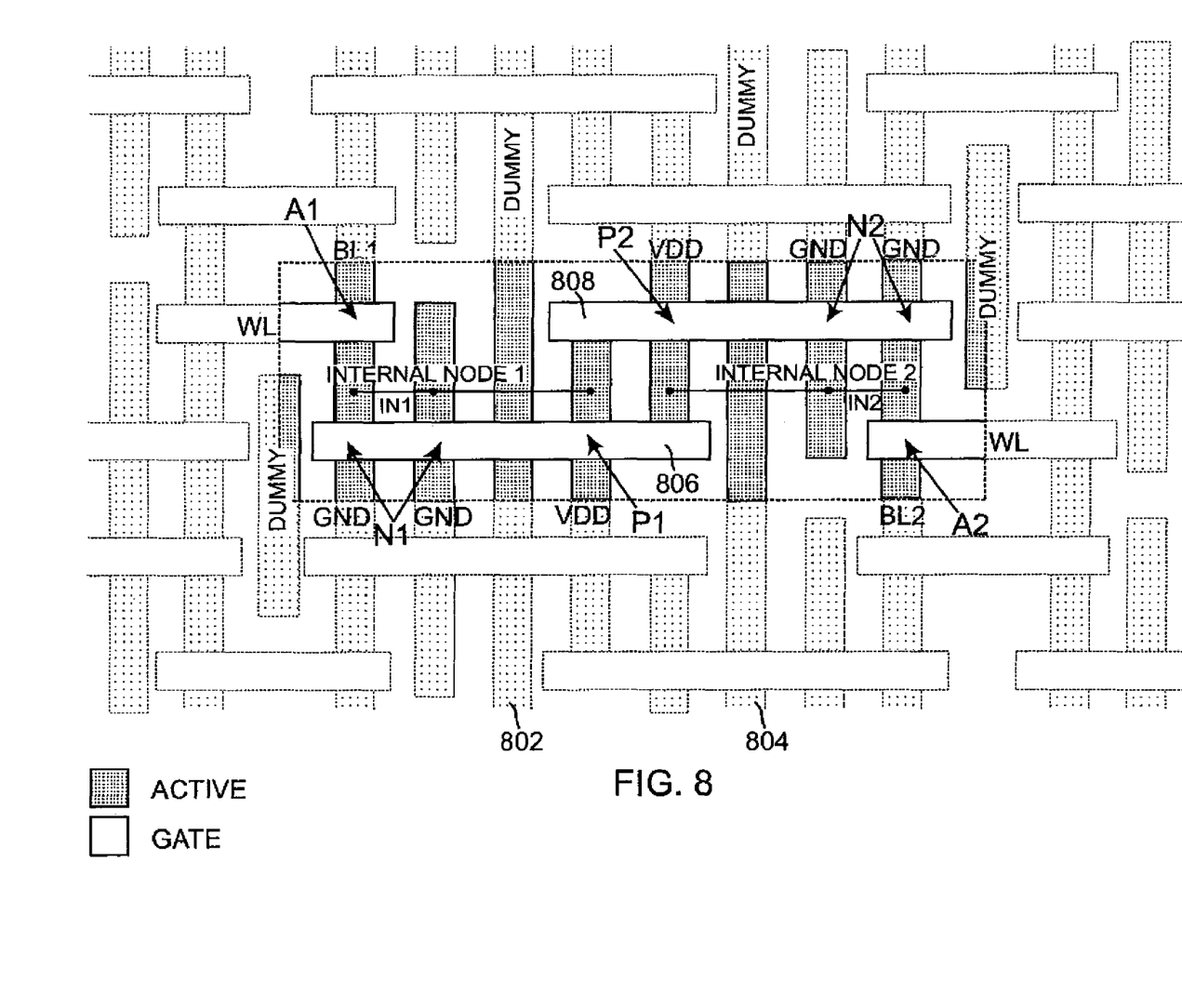
FIG. 8 is a top plan view depicting at least a portion of an exemplary grating-based SRAM unit cell layout employing a fine pitch active grating and dummy active features, in accordance with an embodiment of the invention.

Complete line removal may not always be a preferred solution, however, because while lithography may not be affected (due to the two-step patterning process), other process steps, such as, for example, reactive ion etching and chemical-mechanical planarization, may benefit from a more uniform grating. In such cases, these lines may not need to be completely removed, but merely electrically isolated from other active regions in the device. These electrically isolated active regions may be considered "dummy" active features. As shown in the top plan view of FIG. 8, these additional dummy active features 802, 804 essentially do not serve any purpose other than to form a more complete grating. The dummy features 802, 804 may add some parasitic capacitance, particularly when running below gate lines, whether through design or through misalignment. However, this additional parasitic capacitance is generally not critical in an SRAM array, as the speed of the cell itself does not typically dominate a critical path in the cell. The continuous dummy active region (e.g., 802 or 804) running below the inverter gate (e.g., 806 or 808) may add a significant gate oxide capacitance to the internal nodes (e.g., nodes IN1 and IN2 in FIG. 2), which, ultimately, may be beneficial for improving soft error immunity.

The grating-based SRAM unit cell design of the present invention can be facilitated by using a stacked three-dimensional (3-D) active layer structure, in which upper device layers can be fabricated from, for example, recrystallized silicon (see e.g., Jung et al., 2004 Symp. on VLSI Technology, the disclosure of which is incorporated by reference herein), wafer bonding techniques, or deposited materials (e.g., carbon nanotubes). Because the three device types (e.g., pull-down, pull-up, and pass-gate) can each be formed in separate active layers of the device, each of the layers preferably stacked on top of one another in a substantially vertical dimension, the gate and active region gratings in each of the layers can be beneficially optimized for, among other things, device area efficiency, on an individual basis. An exemplary SRAM unit cell employing multiple stacked active layers is illustrated in the top plan view of FIG. 9, with each of the active layers 902, 904 and 906 depicted in separate panels of the figure.

The vertical ordering of these layers affects only subsequent interconnection steps and not the cell area. The gate and active region pitch is determined predominantly by the minimum spacing needed to place a contact between adjacent gate lines or active region lines, respectively. The cell area can be determined as twice the active region pitch multiplied by twice the gate pitch. The fact that the N-type and P-type devices are in different layers eliminates the need for an N+-to-P+ spacing design rule, which results in about a 13 percent reduction in cell area over an SRAM unit cell layout formed in a single dimension. Furthermore, because the different device types are formed in different layers, each device can be individually optimized. The gate and active region widths can be adjusted (at a fixed pitch) for each layer to thereby adjust the cell β ratio. For example, FIG. 9 has been drawn such that the pull-down device active region width in layer 902 and the pass-gate device gate length in layer 906 have been increased to achieve a larger β ratio compared to standard inverters in the cell. Different threshold voltage adjustment implants can also be easily achieved without separate block masks, since the three device layers 902, 904, 906 are physically isolated from one another.

Figure 9:
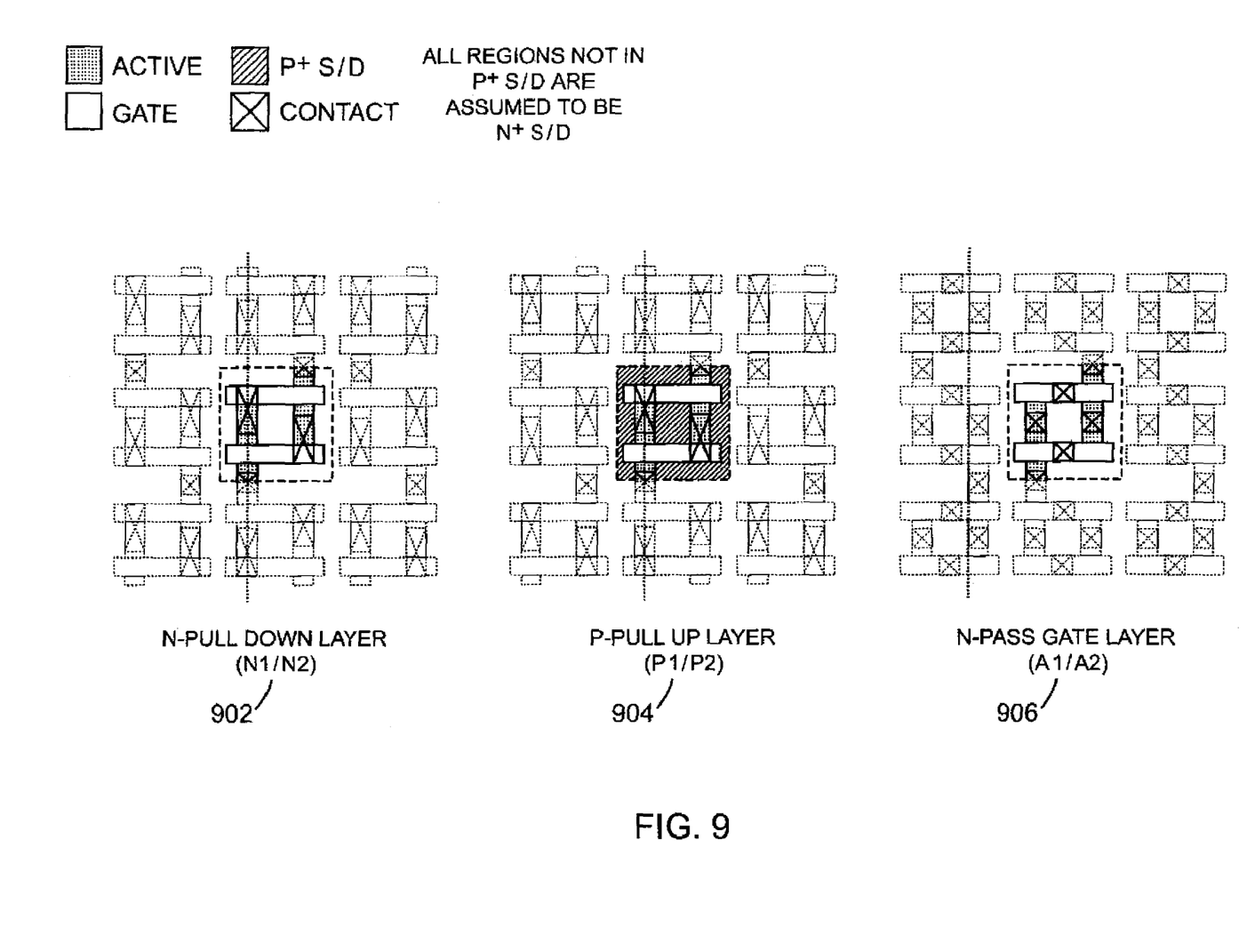
FIG. 9 is a top plan view depicting at least a portion of an exemplary grating-based SRAM unit cell layout employing a plurality of stacked active layers, formed in accordance with an embodiment of the invention.
Figure 10:
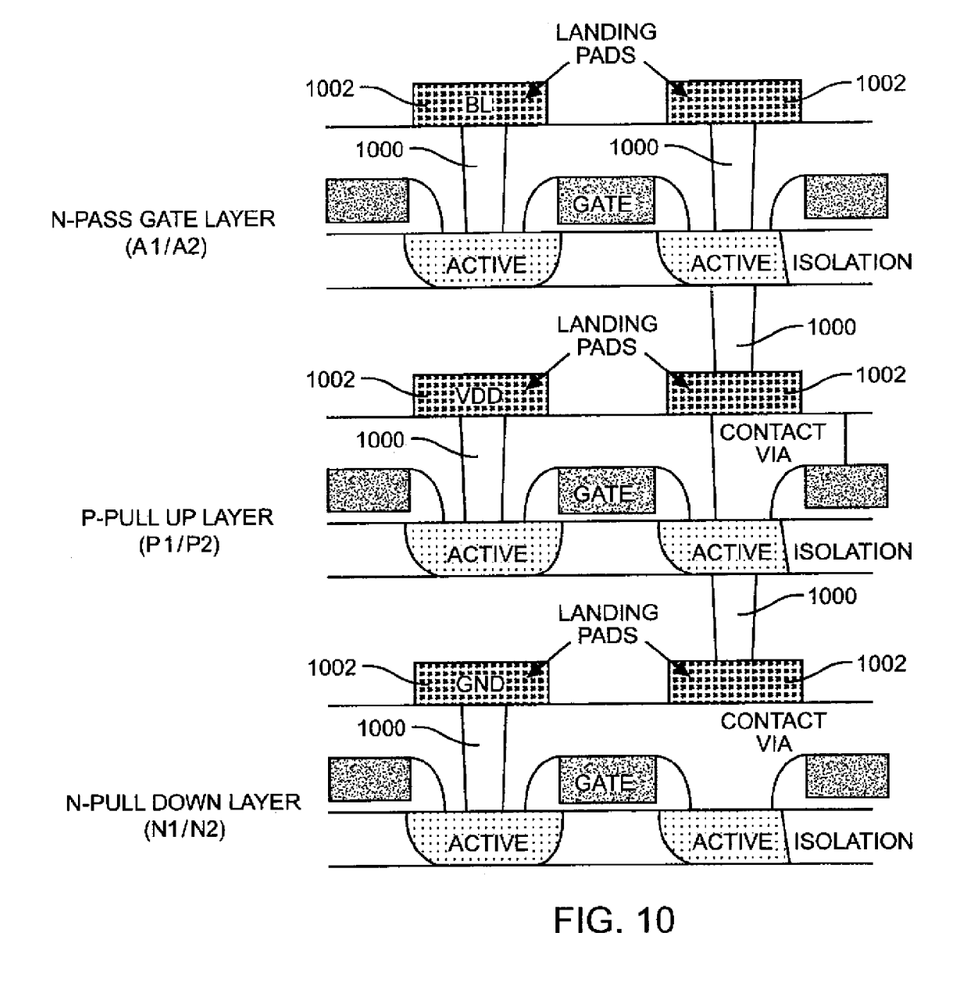
FIG. 10 is a cross-sectional view depicting at least a portion of the illustrative SRAM unit cell shown in FIG. 9, in accordance with the present invention.

The exemplary SRAM unit cell depicted in FIG. 9 assumes an ideal alignment between the three layers. In practice, there may be slight misalignment between the multiple active layers 902, 904, 906 in the device. Layer-to-layer registration tolerance is critical, as formation or transfer of an upper device layer must align to conductive vias in an adjacent layer below. FIG. 10 depicts a cross-sectional view of the exemplary 3-D SRAM unit cell layout shown in FIG. 9. Inter-layer connections made, for example, by way of vias 1000, can be achieved using corresponding landing pads 1002 as a potential solution. A given landing pad 1002 is preferably sized so as to substantially equal a size of the corresponding contact, plus an alignment tolerance with a pitch equal to that of the active grating. As long as the alignment tolerance is smaller than the grating spacing, cell size should be unaffected. The conductive layers used to create landing pads 1002 can also be used to create additional capacitance on the internal nodes, which increases the stored charge and thus beneficially improves immunity to soft errors, in accordance with another aspect of the invention.

The techniques of the present invention described herein are not limited to the specific IC layouts or circuits shown in the accompanying figures. Rather, alternative IC layouts may be similarly employed. Regardless of the circuit fabricated, it is an important aspect of the present invention that both gate and active regions of the device, which are typically orthogonally disposed relative to one another, be formed on a substantially regular grating. In this manner, IC manufacturability and yield are advantageously improved, thereby reducing the cost of the IC device, particularly when the IC device is comprised of a plurality of repeatable circuit cells. Although gates and active regions are preferably formed orthogonal to one another, it is similarly contemplated that the gates and active regions in a given circuit may be oriented non-orthogonally relative to one another, such as, for example, diagonally.

The exemplary layout techniques of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A semiconductor device, comprising:
   a plurality of repeatable circuit cells adapted for connection to one or more conductors providing at least one of electrical connection to the circuit cells and electrical connection between one or more circuit elements in the cells, each of the circuit cells being configured having gates and active regions forming a grating, wherein, for a given active layer in the device, a width of each active region is substantially the same relative to one another, a spacing between any two adjacent active regions is substantially the same, a width of each gate is substantially the same relative to one another, and a spacing between any two adjacent gates is substantially the same, selected portions of the active regions in at least a given one of the circuit cells being removed subsequent to forming an original active region grating, at least a given one of the circuit cells comprising an N-type transistor device and a P-type transistor device connected so as to form an inverter, a ratio of a strength of the N-type transistor device relative to a strength of the P-type transistor device being controlled by at least one of: (i) modifying a voltage threshold of at least one of the transistor devices; and (ii) modifying an effective gate width of at least one of the transistor devices by electrically connecting portions of an adjacent active region grating in parallel;
   wherein a first portion of at least a first selected active region in at least a given one of the circuit cells is doped with a P-type impurity having a known concentration level to change a conductivity of the first selected active region as desired, and a second portion of at least a second active region in the given circuit cell is doped with an N-type impurity having a known concentration level so as to change a conductivity of the second selected active region as desired; and
   wherein the device comprises a plurality of active layers, each of the active layers being stacked in a substantially vertical dimension relative to one another, at least a first one of the plurality of circuit cells being formed in a first one of the active layers, and at least a second one of the plurality of circuit cells being formed in a second one of the active layers.

* * * * *